(12) United States Patent
Zelder et al.

(10) Patent No.: US 8,760,184 B2
(45) Date of Patent: Jun. 24, 2014

(54) MEASURING PROBE FOR A VECTOR NETWORK ANALYSIS SYSTEM

(75) Inventors: Thomas Zelder, Lüneburg (DE); Bernd Geck, Hannover (DE)

(73) Assignee: Rosenberger Hochfrequenztechnik GmbH & Co. KG, Fridolfing (DE)

( * ) Notice: Subject to any disclaimer, the term of this patent is extended or adjusted under 35 U.S.C. 154(b) by 496 days.

(21) Appl. No.: 13/003,704

(22) PCT Filed: Jun. 23, 2009

(86) PCT No.: PCT/EP2009/004527
§ 371 (c)(1),
(2), (4) Date: Feb. 16, 2011

(87) PCT Pub. No.: WO2010/006683
PCT Pub. Date: Jan. 21, 2010

(65) Prior Publication Data
US 2011/0163773 A1   Jul. 7, 2011

(30) Foreign Application Priority Data
Jul. 15, 2008  (DE) .................... 20 2008 009 469 U

(51) Int. Cl.
*G01R 31/302*   (2006.01)
(52) U.S. Cl.
USPC ........ 324/754.21; 702/62; 343/702; 343/703; 324/754.03; 324/754.06
(58) Field of Classification Search
USPC ........... 324/754.03, 754.06, 754.21; 343/702, 343/703; 702/62
See application file for complete search history.

(56) References Cited

U.S. PATENT DOCUMENTS

| 5,508,630 | A  | * | 4/1996  | Klemer et al. |
| 6,239,752 | B1 | * | 5/2001  | Blanchard |
| 7,072,780 | B2 | * | 7/2006  | Wu et al. .................... 702/62 |
| 7,235,982 | B1 | * | 6/2007  | Shoulders ................. 324/638 |
| 7,378,921 | B2 | * | 5/2008  | Ziegler |
| 7,453,276 | B2 | * | 11/2008 | Hayden et al. |
| 2003/0115008 | A1 | * | 6/2003  | Doi ............................ 702/117 |
| 2006/0119523 | A1 | * | 6/2006  | Aisenbrey |
| 2006/0279275 | A1 | * | 12/2006 | Simpson ................ 324/158.1 |

(Continued)

FOREIGN PATENT DOCUMENTS

| DE | 102006030630 B3 | 10/2007 |
| DE | 202007010784 U1 | 10/2007 |

(Continued)

OTHER PUBLICATIONS

Unknown, "The Basics of Loop Vehicle Detection," Nov. 10, 2000. www.marshproducts.com.*

(Continued)

*Primary Examiner* — Patrick Assouad
*Assistant Examiner* — Sean Curtis
(74) *Attorney, Agent, or Firm* — DeLio, Peterson & Curcio, LLC; Robert Curcio

(57) ABSTRACT

A measuring probe, particularly for a non-contacting vector network analysis system, having a housing and at least one coupling structure disposed on the housing and designed for coupling an HF signal from a signal line, such that at least one additional signal probe is disposed on the housing for coupling an electrical signal into the signal line.

26 Claims, 1 Drawing Sheet

(56) References Cited

U.S. PATENT DOCUMENTS

| | | | |
|---|---|---|---|
| 2007/0001686 A1* | 1/2007 | Parker et al. | 324/529 |
| 2007/0063914 A1* | 3/2007 | Becker | |
| 2008/0074129 A1 | 3/2008 | Hayden et al. | |
| 2009/0261900 A1* | 10/2009 | Ilkov | |

FOREIGN PATENT DOCUMENTS

| | | |
|---|---|---|
| JP | 2001-174441 A | 6/2001 |
| JP | 2004-85477 A | 3/2004 |
| JP | 2004-325123 A | 11/2004 |
| JP | 2007-101330 A | 4/2007 |

OTHER PUBLICATIONS

Yhland et al., "Noncontacting Measurements of Power in Microstrip Circuits," ARFTG Conference, 67$^{th}$ Edition, IEEE, Jun. 16, 2006.*

Unknown, "Easy, Ultra-precise submicron probing" Online. (C) 2000. URL: http://www.mbelectronique.fr/MS1-44-DS.pdf.*

Unknown, "System and Method for Measuring Active Load Pull Using a Vector Network Analyzer," May 18, 2008. Ip.Com #IPCOM000170559 D.*

Yhland et al. "Noncontacting Measurements of Power in Microstrip Circuits." ARFTG Conference, 2006, 67th, IEEE, Jun. 16.*

Unknown, "Easy, Ultra-precise submicron probing" Online. (C) 2000.*

Unknown, "System and Method for Measuring Active Load Pull Using a Vector Network Analyzer," May 18, 2008. Ip.Com #IPCOM000170559D.*

Whiteside, H. & King, R.W.P. "The Loop Antenna as a Probe." IEEE. Oct. 21, 1963.*

H. Whiteside, R. W. P. King "The loop antenna as a probe", IEEE Transactions on Antennas and Propagation, vol. 12, No. 3, pp. 291-297, May 1964.

M. Kanda, "An electromagnetic near-field sensor for simultaneous electric and magnetic-field measurements", IEEE Transactions on Electromagnetic Compatibility, vol. 26, No. 3, pp. 102-110, Aug. 1984.

M. E. G. Upton, A. C. Marvin, "Improvements to an electromagnetic near-field sensor for simultaneous electric and magnetic field measurements", IEEE Transactions on Electromagnetic Compatibility, vol. 35, No. 1, pp. 96-98, Feb. 1993.

K. W. Wagner "Induktionswirkung von Wanderwellen in Nachbarleitungen" [Inductive effect of travelling waves on neighboring lines], Elektronische Zeitschrift, vol. 35, pp. 639-643, 677-680, 705-708, 1914.

B. Maher, "An L-band loop-type coupler," IEEE Transactions on Microwave Theory and Techniques, vol. 9, No. 4, pp. 362-363, Jul. 1961.

K. Yhland, J. Stenarson, "Noncontacting measurement of power in microstrip circuits," in 65th ARFTG, pp. 201-205, Jun. 2006.

T. Zelder, H. Eul, "Contactless network analysis with improved dynamic range using diversity calibration," Proceedings of the 36th European Microwave Conference, Manchester UK, pp. 478-481, Sep. 2006.

T. Zelder, H. Rabe, H. Eul, "Contactless electromagnetic measuring system using conventional calibration algorithms to determine scattering parameters," Advances in Radio Sciences—Kleinheubacher Berichte 2006, vol. 5, 2007.

T. Zelder, I. Rolfes, H. Eul, "Contactless vector network analysis using diversity calibration with capacitive and inductive coupled sources," Advances in Radio Science—Kleinheubacher Berichte, vol. 5, 2007.

P. P. Lombardini, R. F. Schwartz, P. J. Kelly, "Criteria for the design of loop-type directional couplers for the L band," IEEE Transactions on Microwave Theory and Techniques, vol. 4, No. 4, pp. 234-239, Oct. 1956.

T. Zelder, B. Geck, M. Wollitzer, I. Rolfes and H. Eul, "Contactless network analysis system for the calibrated measurement of the scattering parameters of planar two-port devices," Proceedings of the 37th European Microwave Conference, Munich, Germany, pp. 246-249, Oct. 2007.

F. De Groote, J. Verspecht, D. Barataud and J.-P. Teyssier, "An improved coupling method for time domain load-pull measurements," European Microwave Conference, vol. 1, p. 4 et seq. BNSDOCID—XP10903353A, Oct. 2005.

J. Stenarson, K. Yhland, "An In-Circuit Noncontacting Measurement Method for S-Parameters and Power in Planar Circuits",IEEE Transactions on Microwave Theory and Techniques, vol. 49, No. 12. Dec. 2001, pp. 2567-2572.

Zelder, Thomas et al.; "Contactless Network Analysis System for the Calibrated Measurement of the Scattering Parameters of Planar Two-Port Devices", Microwave Conference, 2007, IEEE, Oct. 2007, pp. 246-249, XP031191780.

Yhland K. et al.; Noncontacting Measurement of Power in Microstrip Circuits; ARFTG Conference, 2006 67th, IEEE, Jun. 16, 2006, pp. 201-205, XP031384116.

Stenarson, Jorgen, et al.; An In-Circuit Noncontacting Measurement Method for S-Parameters and Power in Planar Ciruits, IEEE Transactions, vol. 49, No. 12, Dec. 2001, pp. 2567 and 2569.

Anonymous: "Easy, Ultra-Precise Submicron Probing", [Online] URL:http//www.cmicro.com/download.cfm?downloadfile=CFA9D881-5056-B03B-BA1232577B319315>, whole document, Jan. 26, 2001, pp. 1-2, XP002550524.

Anonymous: Programmable Micropositioners for RF/icrowave Applications, [Online] URL:http://www.cmicro.com/download.cfm?downloadfile=CFA9D891-5056-B03B-BA856EE708226FFF>, whole document, XP002550525, Apr. 2000.

* cited by examiner

MEASURING PROBE FOR A VECTOR NETWORK ANALYSIS SYSTEM

MEASURING PROBE

This application is a National Stage filing based on PCT/EP2009/004527, filed Jun. 23, 2009, and which claims priority to German Patent Application No. DE 20 2008 009 469.0, filed Jul. 15, 2008.

BACKGROUND OF THE INVENTION

1. Field of the Invention

The present invention relates to a measuring probe, in particular for a contactless vector network analysis system, having a housing and, arranged on the housing, at least one coupling structure which is designed to couple an RF signal out from a signal line.

2. Description of Related Art

The use of contactless loop-type measuring probes for detecting interfering emissions is known, particularly in the field of electromagnetic compatibility (EMC), from for example H. Whiteside, R. W. P. King "The loop antenna as a probe", IEEE Transactions on Antennas and Propagation, Vol. 12, No. 3, pp. 291-297, May 1964, or M. Kanda, "An electromagnetic near-field sensor for simultaneous electric and magnetic-field measurements", IEEE Transactions on Electromagnetic Compatibility, Vol. 26, No. 3, pp. 102-110, August 1984, or M. E. G. Upton, A. C. Marvin, "Improvements to an electromagnetic near-field sensor for simultaneous electric and magnetic field measurements", IEEE Transactions on Electromagnetic Compatibility, Vol. 35, No. 1, pp. 96-98, February 1993.

it is also known for loop-type probes to be used in the production of directional couplers from, for example, K. W. Wagner "Induktionswirkung von Wanderwellen in Nachbarleitungen" [Inductive effect of travelling waves on neighboring lines], Elektronische Zeitschrift, Vol. 35, pp. 639-643, 677-680, 705-708, 1914; P. P. Lombardini, R. F. Schwartz, P. J. Kelly, "Criteria for the design of loop-type directional couplers for the L band," IEEE Transactions on Microwave Theory and Techniques, Vol. 4, No. 4, pp. 234-239, October 1956; B. Maher, "An L-band loop-type coupler," IEEE Transactions on Microwave Theory and Techniques," Vol. 9, No. 4, pp. 362-363, July 1961; F. De Groote, J. Verspecht, C. Tsironis, D. Barataud and J.-P. Teyssier, "An improved coupling method for time domain load-pull measurements," European Microwave Conference, Vol. 1, p. 4 et seq. October 2005 or K. Yhland, J. Stenarson, "Noncontacting measurement of power in microstrip circuits," in 65th ARFTG, pp. 201-205, June 2006.

A directional coupler is a four-port device which generally comprises two lines which are coupled to one another. The job of the directional coupler is to separate the forward and backward waves on a line.

Rather than loop-type probes, probes that are also used in EMC technology and for characterizing electrical components are purely inductive or capacitive probes, as is known for example from T. Zelder, H. Eul, "Contactless network analysis with improved dynamic range using diversity calibration," Proceedings of the 36th European Microwave Conference, Manchester UK, pp. 478-481, September 2006; T. Zelder, H. Rabe, H. Eul, "Contactless electromagnetic measuring system using conventional calibration algorithms to determine scattering parameters," Advances in Radio Sciences—Kleinheubacher Berichte 2006, Vol. 5, 2007; T. Zelder, I. Rolfes, H. Eul, "Contactless vector network analysis using diversity calibration with capacitive and inductive coupled sources," Advances in Radio Science—Kleinheubacher Berichte, Vol. 5, 2007, or J. Stenarson, K. Yhland, C. Wingqvist, "An in-circuit noncontacting measurement method for S-parameters and power in planar circuits," IEEE Transactions on Microwave Theory and Techniques, Vol. 49, No. 12, pp. 2567-2572, December 2001.

A possible coupling structure for separating forward and backward waves is the loop-type directional coupler, which was described by P. P. Lombardini, R. F. Schwartz, P. J. Kelly in "Criteria for the design of loop-type directional couplers for the L band," IEEE Transactions on Microwave Theory and Techniques, Vol. 4, No. 4, pp. 234-239, October 1956 and by B. Maher in "An L-band loop-type coupler," IEEE Transactions on Microwave Theory and Techniques, Vol. 9, No. 4, pp. 362-363, July 1961.

A loop-type directional coupler comprises a conductor loop which is positioned above or in a waveguide. Waveguides of any desired kinds may be used in this case such as hollow guides, planar strip lines, or co-axial lines. There are a variety of uses for a loop-type directional coupler. F. De Groote, et al. (op. cit), for example, used a loop-type directional coupler as a component of a contactless measuring system in 2005 and Yhland, et al. (op. cit.), used one as a component of a contactless measuring system in 2006.

Scattering parameters of electrical components embedded in a complex circuit can be determined by contactless vector network analysis. This is described in for example T. Zelder, B. Geck, M. Wollitzer, I. Rolfes and H. Eul, "Contactless network analysis system for the calibrated measurement of the scattering parameters of planar two-port devices," Proceedings of the 37th European Microwave Conference, Munich, Germany, pp. 246-249, October 2007. Compared with conventional methods of network analysis where contacts are used, the internal directional couplers of a network analyzer are replaced by contactless near-field measuring probes which are connected directly to the vectorial points of measurement of the analyzer.

SUMMARY OF THE INVENTION

Bearing in mind the problems and deficiencies of the prior art, it is therefore an object of the present invention to improve a measuring probe of the above kind with regard to its accuracy of measurement and scope of application.

This object is achieved in accordance with the invention by a measuring probe of the kind described herein.

Still other objects and advantages of the invention will in part be obvious and will in part be apparent from the specification.

The above and other objects, which will be apparent to those skilled in the art, are achieved in the present invention which is directed to a measuring probe for a contactless vector network analysis system, including a housing and, arranged on the housing, at least one coupling structure which is designed to couple an RF signal out from a signal line which is part of an electrical or electronic circuit on a printed circuit board, said circuit comprises an embedded electrical or electronic component to be tested and other electrical or electronic components, said measuring probe comprising at least one additional signal probe for coupling an electrical signal into the signal line, arranged on the housing.

The measuring probe includes having the signal probe take the form of or include a prod for measurement which contacts the signal line electrically and mechanically, the prod for measurement designed and arranged such that, when the prod for measurement contacts the signal line electrically and mechanically, the coupling structure is at least situated in the near field of the signal line or contacts the signal line electrically and mechanically.

The signal probe may comprise a contactless conductor loop or loop-type probe, which may be a purely inductive, a purely capacitive, or a combined inductive and capacitive probe. The coupling structure may include a prod for measurement which contacts the signal line electrically and mechanically, and which may be a contactless conductor loop or loop-type probe, comprised of a purely inductive, purely capacitive, or combined inductive and capacitive probe.

The coupling structure and the signal probe may be impedance-controlled; the impedances of the signal paths between the signal probe and an input of the signal probe and the impedances of the signal probe and of the input of the signal probe being so matched to one another that a high input return loss is obtained, and the impedances between the coupling structure and the first port of the coupling structure and the second port of the coupling structure, and the impedances of the coupling structure, the first port of the coupling structure and the second port of the coupling structure being so matched to one another that a high input return loss is obtained.

The measuring probe may also include an electrical signal amplifier arranged in an input path of the signal probe, and/or in at least one output path of the coupling structure. The signal probe, the coupling structure, or both may be adapted to receive a DC voltage applied to them.

The measuring probe may include a device for determining a distance between the coupling structure and the signal conductor, such as an optical, electrical, mechanical, electromechanical distance sensor, or any combination thereof.

The measuring probe may comprise a device for determining the position of the measuring probe in space, such as an image sensor.

The measuring probe may include at least one positioning arrangement for positioning it in space, such as a stepper motor.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
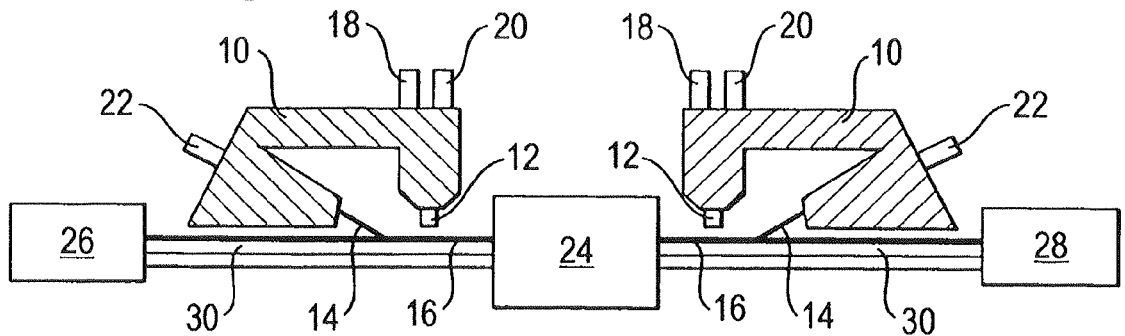
FIG. 1 is a schematic view of a preferred embodiment of measuring probe according to the invention in a measuring rig.

In describing the preferred embodiment of the present invention, reference will be made herein to FIGS. 1-3 of the drawings in which like numerals refer to like features of the invention.

To determine the scattering parameters of a device under test (DUT) with a contactless, generally vectorial, measuring system, use is made of inductive and/or capacitive coupling structures. The measuring probes are positioned in the electromagnetic near field above the signal lines of the device under test. What are determined by means of these coupling structures are either the current and/or the voltage in a signal line which is connected directly to the device under test. Alternatively, what are also measured are the forward and backward waves on the signal line, in which case directional couplers, and in particular loop-type couplers, are then used as coupling structures to separate the two waves from one another. To measure the scattering parameters, conventional methods of calibration, such as TRL for example (G. F. Engen and C. A. Hoer "Thru-reflect-line: an improved technique for calibrating the dual six-port automatic network analyser," IEEE Transactions on Microwave Theory and Techniques, Vol. 12, pp. 987-993, December 1979), are used as in contacting network analysis.

In contactless vector network analysis, at least one measuring probe, such for example as a conductor loop or two capacitive probes, is required for each port of an unknown device under test (DUT) at which measurements are to be made. What are used for example are contactless loops of conductor which are produced from co-axial semi-rigid lines (see F. De Groote, J. Verspecht, C. Tsironis, D. Barataud and J.-P. Teyssier, "An improved coupling method for time domain load-pull measurements," European Microwave Conference, Vol. 1, p. 4 et seq., October 2005 and K. Yhland, J. Stenarson, "Noncontacting measurement of power in microstrip circuits,", in 65th ARFTG, pp. 201-205, June 2006. What are used as alternatives in the contactless measuring systems are solely capacitive probes (see T. Zelder, H. Eul, "Contactless network analysis with improved dynamic range using diversity calibration," Proceedings of the 36th European Microwave Conference, Manchester, UK, pp. 478-481, September 2006 and T. Zelder, H. Rabe, H. Eul, "Contactless electromagnetic measuring system using conventional calibration algorithms to determine scattering parameters," Advances in Radio Science—Kleinheubacher Berichte 2006, Vol. 5, 2007). The measuring systems in T. Zelder, I. Rolfes, H. Eul, "Contactless vector network analysis using diversity calibration with capacitive and inductive coupled probes," Advances in Radio Science—Kleinheubacher Berichte 2006, Vol. 5, 2007, and J. Stenarson, K. Yhland, C. Wingqvist, "An in-circuit noncontacting measurement method for S-parameters and power in planar circuits," IEEE Transactions on Microwave Theory and Techniques, Vol. 49, No. 12, pp. 2567-2572, December 2001, were produced with a combination of capacitive and inductive probes. The special feature of the probes in T. Zelder, et al. (op. cit), is that they are produced on the same substrate together with the signal line.

Although contactless vector network analysis has the potential to enable components to be characterized contactlessly, no contactless measurements of scattering parameters have yet been made on RF or microwave components embedded in a circuit. To date, the positions of the contactless probes have not been varied during or after the calibration, but this is necessary if measurements are to be made within a circuit. By employing pseudo-contactless measurement, unknown, embedded two-port devices were characterized in T. Zelder, B. Geck, M. Wollitzer, I. Rolfes and H. Eul, "Contactless network analysis system for the calibrated measurement of the scattering parameters of planar two-port devices," Proceedings of the 37th European Microwave Conference, Munich, Germany, pp. 246-249, October 2007. What pseudo-contactless measurement means in this case is that printed coupling structures were used rather than totally contactless probes.

For the contactless determination of scattering parameters of a two-port device where the scattering parameters are complex values, two contactless loop-type probes are connected to respective pairs of points of measurement in a vector network analyzer. To characterize a DUT (device under test) embedded between a plurality of components, the probes are positioned on both sides of the supply lines to the DUT in their near field. To determine the scattering parameters, the forward and backward waves of the DUT are measured in two different states. To produce two different states, a network analyzer has a changeover switch, thus enabling the signal to be fed into the circuit once from the left or once from the right. If the forward and backward waves are measured with the switch in both positions, then the full two-port scattering parameters of an embedded DUT can be determined from them. However, in the contactless determination of scattering parameters, there are cases in which it is not possible for the full scattering parameters to be determined. Two cases will be explained in what follows.

Case 1: If for example the final two-port device (34 in FIG. 3, between 44 and 46) in the circuit in which the DUT is embedded is an amplifier which can only be operated in the forward direction (switch position I, see FIG. 3) because it has a very high input impedance in the other direction, and if the two outputs of the switch 54 are connected together at points 36 and 46 in the way which has been usual hitherto in contactless vector network analysis rather than being connected to the planar line 16 as in FIG. 3, then results suitable for analysis are only obtained in switch position I. In switch position II, almost all the power is reflected back to the generator through the amplifier which is operated in reverse and, at the points of measurement of the contactless loop-type probes, the signal for measurement disappears in the noise.

Case 2: If the attenuation of the two-port devices in the circuit to the left and right of the DUT is too high, then the dynamic range is too small for accurate measurement.

In a measuring probe of the present invention, provision is made in accordance with the invention for at least one additional signal probe for coupling an electrical signal into the signal line to be arranged on the housing.

This has the advantage that, for measurements to be made, the signal passed through a DUT does not have to be conveyed to the DUT through all the components of the circuit in which the DUT is embedded and instead the signal is fed in by a prod for measurement (probe) immediately upstream or downstream of the DUT. In this way DUT's can be fully measured in respect of their scattering parameters regardless of what other components may be present in the circuit.

The signal probe usefully takes the form of a contactless conductor loop or a prod for measurement which contacts the signal line electrically and mechanically, the prod for measurement being so designed and arranged that, when the prod for measurement contacts the signal line electrically and mechanically, the coupling structure is at least situated in the near field of the signal line or contacts the signal line electrically and mechanically.

The contactless signal probe usefully takes the form of a purely inductive, purely capacitive or combined inductive and capacitive probe.

In a preferred embodiment, the coupling structure takes the form of a contactless conductor loop or the form of a prod for measurement which contacts the signal line electrically and mechanically.

The contactless coupling structure usefully takes the form of a purely inductive, purely capacitive or combined inductive and capacitive probe.

An earth contact of the coupling structure and an earth contact of the signal probe are usefully connected together electrically.

Because the coupling structure is impedance-controlled, high directional attenuation and high input impedance are obtained and fewer sheath waves are generated, which makes the measuring probe able to be defined more satisfactorily for analytical purposes and make the cut-off frequency higher than it is in the case of non-impedance-controlled measuring probes.

To improve the signal quality, an electrical signal amplifier is arranged in an input path of the signal probe and/or in an output path of the coupling structure.

To set the operating point of the amplifier, the signal probe and/or the coupling structure have a DC voltage applied to them.

In a preferred embodiment, the housing is produced from a metallic material, an absorbent material, and/or a plastics material.

The housing is usefully sheathed in an absorbent material.

To allow the measuring probe to be arranged at a controlled distance from the signal conductor close thereto or in electrical and mechanical contact therewith, as the case may be, there is provided in addition a device for determining a distance between the coupling structure and the signal conductor.

The device for determining the distance comprises for example an optical, electrical, mechanical, and/or electromechanical distance sensor.

To allow the measuring probe to be arranged, under control, in three dimensions near or in mechanical and electrical contact with the signal conductor, there is provided in addition a device for determining the position of the measuring probe in space.

The device for determining the position of the measuring probe in space is for example an image sensor.

In a preferred embodiment, the measuring probe has in addition at least one positioning arrangement for positioning it in space, thus making the measuring probe displaceable in at least one direction in space. The positioning arrangement has for example at least one positioning motor, and in particular a stepping motor, and is preferably arranged on the housing.

To allow the coupling structure and the signal probe to be positioned separately, the measuring probe has separate respective positioning arrangements for the coupling structure and the signal probe.

Figure 2:
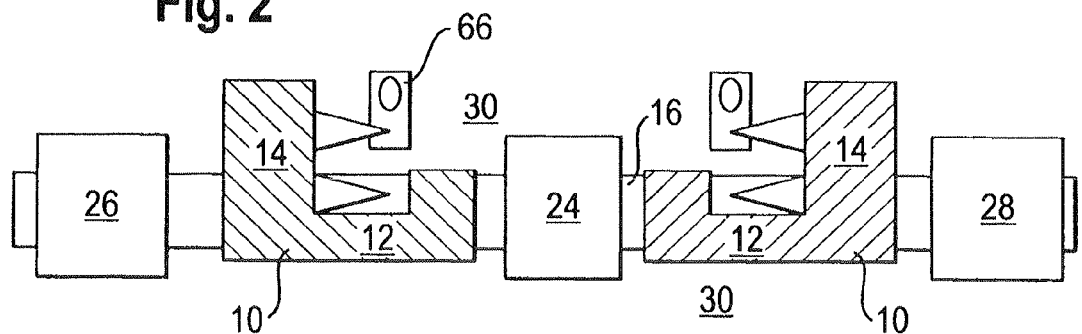
FIG. 2 is a plan view of the preferred embodiment shown in FIG. 1.

The preferred embodiment of the measurement probe according to the invention which is shown in FIGS. 1 and 2 comprises a housing 10, a coupling structure 12 in the form of a contactless measuring loop or loop-type probe and a signal probe 14 in the form of a prod for measurement which contacts a signal line 16 electrically and mechanically. The coupling structure 12 is formed to have a first port 18 and a second port 20 which form an output path, in such a way that it couples an electrical signal out of the signal line 16. The signal probe 14 is formed to have an input 22 in such a way that it couples an electrical signal into the signal line 16. The signal probe 14 is so arranged and designed that the coupling structure 12 is situated in the near field of the signal line 16 and couples a signal out of the signal line 16 contactlessly when the signal probe 14 contacts the signal line 16 electrically and mechanically in the way shown in FIG. 1.

The signal line 16 is part of an electrical or electronic circuit on a printed circuit board 30, which circuit comprises an embedded electrical or electronic component 24 to be tested (the DUT—device under test) and other electrical or electronic components 26, 28. The signal line 16 takes the form of, for example, a stripline.

Figure 3:
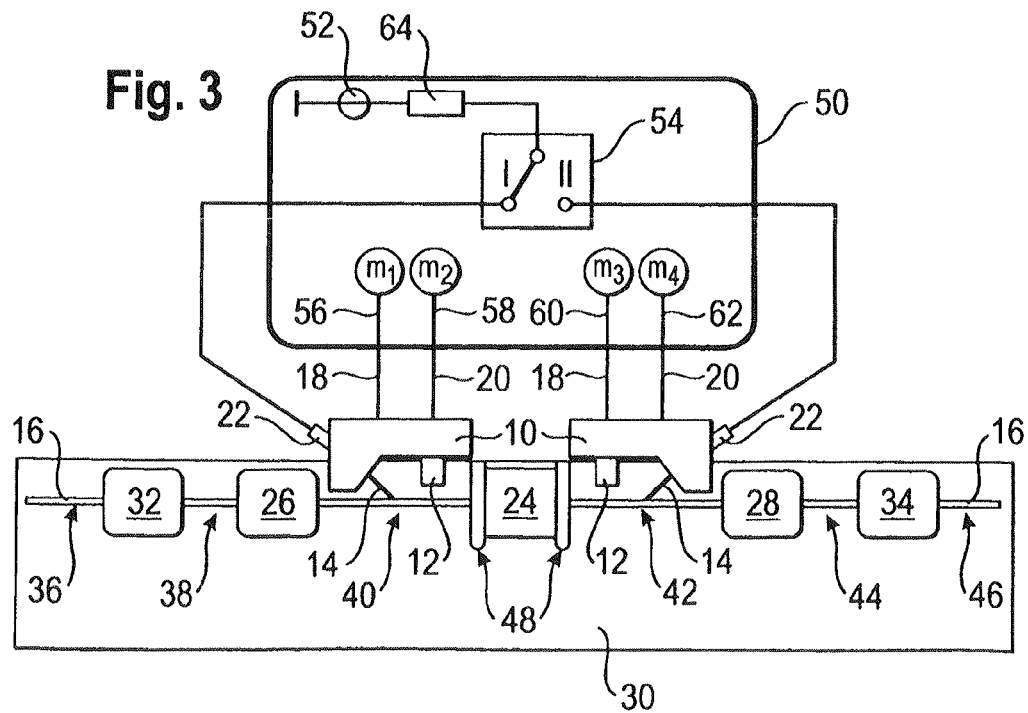
FIG. 3 is a schematic view of a measuring rig having a vector network analyzer (VNA).

In FIG. 3, parts which operate in the same way are identified by the same reference numerals as in FIG. 1 and attention is therefore directed to the above description of FIG. 1 for an explanation of them. On the printed circuit board 30, the electronic circuit comprises in addition electronic components 32 and 34 which take the form of for example, amplifiers which can only be operated in the forward direction and which have a very high intrinsic impedance in the other direction. The components 26, 28, 32 and 34 and the DUT 24 are in essence two-port devices which are looped into the signal line 16. Also, 36 designates a first position on the printed circuit board 30 and 38 designates a second position, 40 a third position, 42 a fourth position, 44 a fifth position, and 46 a sixth position thereon. 48 designates reference levels. Shown in FIG. 3 is a measuring arrangement which has two measuring probes according to the invention and a vector network analyzer (VNA) 50. The VNA 50 comprises a signal source 52, a switch 54 having a switched position I and a switched position II, a first measuring port 56, a second measuring port 58, a third measuring port 60, and a fourth measuring port 62. Reference numeral 64 identifies a complex impedance Zg of the analyzer. The signal source 52 is connected via the switch 54 to an input 22 of one or other of the signal probes 14. The measurement ports 56, 58, 60, and 62 are connected to the outputs 18 and 20. Depending on the position of the switch 54, the signal from the signal source 52 is coupled into the signal line 16 by the signal probes 14 on different sides of the DUT 24.

By means of the measuring probe according to the invention, it is possible for the power of the signal coupled into the signal line 16 not to be fed through all the components 26, 28, 32, 34 to the DUT 24 but to be fed in directly upstream of the DUT 24 by means of the signal probes 12. The coupling structures 12 are then each positioned after, or rather downstream of, the in-feed of the power. In accordance with the invention, the contactless coupling structure 12 and the contact-equipped signal probe are combined into a unit, preferably in a housing. A further advantage of a combined measuring probe lies in the fact that an optimized combination requires less room for its positioning. As a rule, the distance between two devices which may be under test, such as the components 24, 26, 28, 32, 34 of the electronic circuit, is very limited. Another advantage is that it is possible for a DC voltage to be fed as a bias to amplifiers which may be present in the measuring probe. The signal-to-noise ratio can be improved by the use of amplifiers. Because of the use of the measuring probe according to the invention having the signaling prod for measurement 14, the ends of the planar circuit being examined are left unconnected, as can be seen from FIG. 3. If a 7-term calibrating process is used, the feedback from the unconnected ends does not affect the results of the measurement.

Shown in FIG. 2, by way of example, is how the construction of a planar micro-strip circuit to be examined on the printed circuit board 30 is modified to enable the combined measuring probe according to the invention to be used. For signaling purposes, there is provided in the embodiment shown by way of example in FIG. 2, next to the planar micro-strip line 16, a contact pad having a via 66 to earth. If, in a different embodiment, the devices under test are connected to co-planar lines, additional contact pads do not have to be provided in the circuit. The form of the signal probe 14 providing the feed is then that of a conventional on-wafer prod for measurement which is connected to the contactless probe 12 via the housing.

The combination measuring probe according to the invention comprises at least one coupling structure 12, which couples out at least part of an electromagnetic wave travelling along an external line 16, and at least one signal probe 14 whose job is to transmit power to the external line 16. The coupling structure 12 and the signal probe 14 may both be contactless or contact-equipped in this case or may be a combination of contactless and contact-equipped. In other words, at least one coupling structure 12 is combined with at least one signaling prod for measurement 14 to form a measuring probe unit. The earths or grounding of the two types of probe (the coupling structure 12 and the signal probe 14) are usefully connected together electrically. The two types of probe preferably have a common housing and a common mounting.

The combination measuring probe according to the invention is particularly suitable for use in a contactless vector network analysis system, as shown in FIG. 3. However, other areas of use are also a possibility.

In an illustrative embodiment, the geometry of the contact-equipped prod for measurement 14 is the same as that of a conventional on-wafer probe. For this embodiment, it is important for the prod for measurement 14 to have at least one metal contact plate by which electrical contact is made with a (planar) waveguide 16 to which the DUT 24 is connected electrically. As an option, the metal contact plate(s) may be connected via an internal waveguide (within the housing 10 of the measuring probe) to an external interface (such as an SMA connector for example). The external interface is used to connect the prod for measurement 14 to a generator 52.

The prod for measurement 14 and the coupling structure are for example each produced to be impedance-controlled, i.e. their input return loss is maximized.

What are used as the coupling structure 12 and signal probe 14 are for example inductive probes, capacitive probes, or combinations of purely inductive and purely capacitive probes. The contactless coupling structure may for example take the form of a loop-type probe.

in a preferred refinement of the invention, amplifiers for improving the quality of the signals are provided in the input path 22 of the prod for measurement 14 and/or in the output paths 18, 20 of the coupling structure 12. This turns the combination measuring probe according to the invention into an active measuring probe. In an active measuring probe, it may possibly be useful for the prod for measurement 14 and the coupling structure 12 to be connected to a DC source (a biasing source) to supply the amplifiers with a DC voltage superimposed on the RF test signal to allow the operating point to be set.

The housing of the combination measuring probe according to the invention may be made of any desired materials. What is provided may for example be a metal housing which is sheathed in an absorbent material. Alternatively, a housing of plastics material or an absorbent housing may be provided.

The combination measuring probe according to the invention may for example have sensors for automatic positioning or for detecting a position in three dimensions.

Connecting to the coupling structure 12 is preferably at least one waveguide, with the end of the waveguide forming an interface. If there are two waveguides connected, this is generally referred to as a probe loop. It is also possible for more than one or two waveguides to be connected to the coupling structure 12 in the respective cases. The coupling structure 12 may also comprise individual probes (such as capacitive probes for example).

in a preferred refinement, the combination measuring probe according to the invention has facilities for adjustment in three dimensions, thus enabling the distance between the contactless coupling structure 12 and the waveguide 16 to which the DUT 24 is connected to be set for example. The position of the coupling structure 12 relative to the prod for measurement 14 is for example varied with the facilities for adjustment in three dimensions (such as a linear X-Y-Z table for example). The facilities for adjustment in three dimensions are designed to be controllable mechanically or electrically for example in this case. The adjustment process may be automated so that it is always the best position for coupling which is selected.

Another preferred refinement of the invention is concerned with combining the combination forming the combination measuring probe with a positioning arrangement so that the combination measuring probe can be displaced in all the dimensions or only in one or two etc. of them. The positioning arrangement is for example incorporated in the housing or is connected to the combination measuring probe via a mounting. The positioning arrangement is for example able to be operated manually and/or motorized. Hence it is active or passive. The positioning arrangement preferably includes a control line for control purposes.

The combination measuring probe according to the invention may for example have two separate positioning arrangements which enable the contact-equipped signal probe 14 and the contactless coupling structure 12 to be positioned separately from one another or in other words their positions to be set independently of one another.

The coupling structure (12) may also comprise a plurality of individual capacitive or inductive probes and/or probes which couple both inductively and capacitively.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A measuring probe for a contactless vector network analysis system, including a housing and, arranged on the housing, at least one coupling structure which is designed to couple an RF signal out from a signal line which is part of an electrical or electronic circuit on a printed circuit board, said circuit comprises an embedded electrical or electronic component to be tested and other electrical or electronic components, said measuring probe comprising at least one additional coupling structure in the form of a contactless conductor loop for coupling an electrical signal into the signal line, arranged on the housing.

2. The measuring probe according to claim 1, including having the contactless signal probe comprise a purely inductive, a purely capacitive, or a combined inductive and capacitive probe.

3. The measuring probe of claim 1, wherein the coupling structure includes a prod for measurement which contacts the signal line electrically and mechanically.

4. The measuring probe of claim 1, wherein the coupling structure includes a contactless conductor loop or loop-type probe.

5. The measuring probe of claim 4, wherein the contactless coupling structure includes a purely inductive, purely capacitive, or combined inductive and capacitive probe.

6. The measuring probe of claim 1, including a device for determining a distance between the coupling structure and the signal conductor.

7. The measuring probe of claim 6, wherein the device for determining the distance comprises an optical, electrical, mechanical, electromechanical distance sensor, or any combination thereof.

8. The measuring probe of claim 1, comprising a device for determining the position of the measuring probe in space.

9. The measuring probe of claim 8, wherein the device for determining the position of the measuring probe in space includes an image sensor.

10. The measuring probe of claim 9, wherein the measuring probe includes at least one positioning arrangement for positioning it in space.

11. The measuring probe of claim 10, wherein the positioning arrangement includes at least one positioning motor.

12. The measuring probe of claim 10, including having separate respective positioning arrangements for the coupling structure and the signal probe.

13. The measuring probe of claim 10, including having the positioning arrangement on the housing.

14. The measuring probe of claim 2, wherein the coupling structure includes a prod for measurement which contacts the signal line electrically and mechanically.

15. The measuring probe of claim 2 including an electrical signal amplifier arranged in an input path of the signal probe.

16. The measuring probe of claim 5 including an electrical signal amplifier arranged in an input path of the signal probe.

17. The measuring probe of claim 2, including a device for determining a distance between the coupling structure and the signal conductor.

18. The measuring probe of claim 5, including a device for determining a distance between the coupling structure and the signal conductor.

19. The measuring probe of claim 17, wherein the device for determining the distance comprises an optical, electrical, mechanical, electromechanical distance sensor, or any combination thereof.

20. The measuring probe of claim 18, wherein the device for determining the distance comprises an optical, electrical, mechanical, electromechanical distance sensor, or any combination thereof.

21. The measuring probe of claim 6, comprising a device for determining the position of the measuring probe in space.

22. The measuring probe of claim 21, wherein the device for determining the position of the measuring probe in space includes an image sensor.

23. The measuring probe of claim 10, including a stepping motor used for positioning.

24. A measuring probe for a contactless vector network analysis system, including a housing and, arranged on the housing, at least one coupling structure which is designed to couple an RF signal out from a signal line which is part of an electrical or electronic circuit on a printed circuit board, said circuit comprises an embedded electrical or electronic component to be tested and other electrical or electronic components, said measuring probe comprising at least one additional signal probe for coupling an electrical signal into the signal line, arranged on the housing, said measuring probe including having the coupling structure and the signal probe be impedance-controlled, the impedances of the signal paths between the signal probe and an input of the signal probe and the impedances of the signal probe and of the input of the signal probe being so matched to one another that a high input return loss is obtained, and the impedances between the coupling structure and the first port of the coupling structure and the second port of the coupling structure, and the impedances of the coupling structure, the first port of the coupling structure and the second port of the coupling structure being so matched to one another that a high input return loss is obtained.

25. A measuring probe for a contactless vector network analysis system, including a housing and, arranged on the housing, at least one coupling structure which is designed to couple an RF signal out from a signal line which is part of an electrical or electronic circuit on a printed circuit board, said circuit comprises an embedded electrical or electronic component to be tested and other electrical or electronic components, said measuring probe comprising at least one additional signal probe for coupling an electrical signal into the signal line, arranged on the housing, including having the signal probe comprise a contactless conductor loop or loop-type probe, wherein said contactless conductor loop or loop-type probe comprises a purely inductive, a purely capacitive, or a combined inductive and capacitive probe, said coupling structure and said signal probe being impedance-controlled, the impedances of the signal paths between the signal probe and an input of the signal probe and the impedances of the signal probe and of the input of the signal probe being so matched to one another that a high input return loss is obtained, and the impedances between the coupling structure and the first port of the coupling structure and the second port of the coupling structure, and the impedances of the coupling structure, the first port of the coupling structure and the second port of the coupling structure being so matched to one another that a high input return loss is obtained.

26. A measuring probe for a contactless vector network analysis system, including:
  a housing and, arranged on the housing, at least one coupling structure which is designed to couple an RF signal out from a signal line which is part of an electrical or electronic circuit on a printed circuit board, said circuit comprises an embedded electrical or electronic component to be tested and other electrical or electronic components, said measuring probe comprising at least one additional signal probe for coupling an electrical signal into the signal line, arranged on the housing;
  wherein the coupling structure includes a contactless conductor loop or loop-type probe; and
  wherein the contactless coupling structure includes a purely inductive, purely capacitive, or combined inductive and capacitive probe; and
  including having the coupling structure and the signal probe be impedance-controlled, the impedances of the signal paths between the signal probe and an input of the signal probe and the impedances of the signal probe and of the input of the signal probe being so matched to one another that a high input return loss is obtained, and the impedances between the coupling structure and the first port of the coupling structure and the second port of the coupling structure, and the impedances of the coupling structure, the first port of the coupling structure and the second port of the coupling structure being so matched to one another that a high input return loss is obtained.

* * * * *